(12) United States Patent
Nakata et al.

(10) Patent No.: US 9,029,873 B2
(45) Date of Patent: May 12, 2015

(54) SEMICONDUCTOR DEVICE INCLUDING AN ALUMINUM NITRIDE LAYER HAVING A CALCULATED AREA-AVERAGED CIRCULARITY AND A METHOD OF MANUFACTURING THE DEVICE

(71) Applicant: Sumitomo Electric Industries, Ltd., Osaka-shi, Osaka (JP)

(72) Inventors: Ken Nakata, Yokohama (JP); Keiichi Yui, Yokohama (JP); Tsuyoshi Kouchi, Yokohama (JP); Isao Makabe, Yokohama (JP); Hiroyuki Ichikawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/198,114

(22) Filed: Mar. 5, 2014

(65) Prior Publication Data

US 2014/0252377 A1 Sep. 11, 2014

(30) Foreign Application Priority Data

Mar. 7, 2013 (JP) ................. P2013-045746

(51) Int. Cl.
| | |
|---|---|
| *H01L 29/15* | (2006.01) |
| *H01L 21/20* | (2006.01) |
| *H01L 29/66* | (2006.01) |
| *H01L 29/778* | (2006.01) |
| *H01L 29/10* | (2006.01) |
| *H01L 29/20* | (2006.01) |
| *H01L 21/02* | (2006.01) |

(52) U.S. Cl.
CPC .... *H01L 29/66068* (2013.01); *H01L 29/66462* (2013.01); *H01L 29/7787* (2013.01); *H01L 29/1029* (2013.01); *H01L 29/2003* (2013.01); *H01L 21/02378* (2013.01); *H01L 21/02458* (2013.01); *H01L 21/02494* (2013.01); *H01L 21/0254* (2013.01); *H01L 21/0262* (2013.01)

(58) Field of Classification Search
None
See application file for complete search history.

(56) References Cited

U.S. PATENT DOCUMENTS

| | | | |
|---|---|---|---|
| 2009/0045438 A1* | 2/2009 | Inoue et al. | 257/192 |
| 2013/0005118 A1* | 1/2013 | Jun et al. | 438/478 |

FOREIGN PATENT DOCUMENTS

| | | |
|---|---|---|
| JP | 2002-100642 | 4/2002 |
| JP | 2006-269862 | 10/2006 |

* cited by examiner

*Primary Examiner* — Scott B Geyer
(74) *Attorney, Agent, or Firm* — Smith, Gambrell & Russell LLP (57) ABSTRACT

The semiconductor device includes a SiC substrate; an aluminum nitride layer provided on the substrate and having an island-shaped pattern consisting of plural islands: a channel layer provided on the AlN layer and comprising a nitride semiconductor; an electron supplying layer provided on the channel layer and having a band gap larger than that of the channel layer; and a gate, source and drain electrodes on the electron supply layer. The AlN layer has an area-averaged circularity Y/X of greater than 0.2. Y is a sum of values obtained by multiplying circularities of the plural islands by areas of the plural islands respectively, X is a sum of the areas of the plural islands. The circularity are calculated by a formula of $(4\pi \times area)/(length\ of\ periphery)^2$ where the area and the length of periphery are an area and a length of periphery of each island.

18 Claims, 12 Drawing Sheets

SEMICONDUCTOR DEVICE INCLUDING AN ALUMINUM NITRIDE LAYER HAVING A CALCULATED AREA-AVERAGED CIRCULARITY AND A METHOD OF MANUFACTURING THE DEVICE

BACKGROUND OF THE INVENTION

1. Field of the Invention

The present invention relates to a semiconductor device and a method of manufacturing the same, and more particularly to a semiconductor device and a method of manufacturing the same, in which a nitride semiconductor is provided on a silicon carbide (SiC) substrate.

2. Related Background Art

A semiconductor device using a nitride semiconductor, e.g., a Field Effect Transistor (FET) such as a High Electron Mobility Transistor (HEMT) and the like has been used as an amplification element operating at a high frequency and high power. Various investigations have been made to improve an off-breakdown voltage of the semiconductor device for a high-powered operation (as described, for example, in Japanese Patent Application Laid-Open Publication No. 2006-269862 and Japanese Patent Application Laid-Open Publication No. 2002-100642).

SUMMARY OF THE INVENTION

However, in a conventional method, a manufacturing deviation increases such that a semiconductor device with a high off-breakdown voltage is obtained while a semiconductor device with a low off-breakdown voltage is significantly manufactured. A mixture of the semiconductor device having the low off-breakdown voltage with the semiconductor device having the high off-breakdown voltage causes a manufacturing yield to decrease, and is related to reliability.

The present invention has been made to solve the problem, and an aspect of the present invention is to restrain an occurrence of a semiconductor device with a low off-breakdown voltage.

In accordance with an aspect of the present invention, a semiconductor device is provided. The semiconductor device includes: an silicon carbide (SiC) substrate; an aluminum nitride (AlN) layer provided on the SiC substrate and having an island-shaped pattern consisting of plural islands; a channel layer provided on the AlN layer and comprising a nitride semiconductor; an electron supplying layer provided on the channel layer and having a band gap larger than that of the channel layer; and a gate electrode, a source electrode and a drain electrode provided on the electron supply layer, wherein the AlN layer has an area-averaged circularity Y/X of greater than 0.2, in which Y is a sum of values obtained by multiplying circularities of the plural islands by areas of the plural islands respectively, and X is a sum of the areas of the plural islands, the circularity being calculated by a formula of $(4\pi \times \text{area})/(\text{length of periphery})^2$ where the area and the length of periphery in the formula are an area and a length of periphery of each island respectively. According to the aspect of the present invention, it is possible to restrain the occurrence of the semiconductor device with a low off-breakdown voltage.

In accordance with another aspect of the present invention, a method of manufacturing a semiconductor device is provided. The method includes: forming an AlN layer on an SiC substrate by using a metal organic chemical vapor deposition (MOCVD) under conditions in which a growth temperature is equal to or lower than 1100° C., a growth pressure is equal to or higher than 38 Torr, and a ratio of raw gases V/III is equal to or larger than 500; forming a channel layer comprising a nitride semiconductor on the AlN layer; forming an electron supplying layer on the channel layer, the electron supplying layer having a band gap larger than that of the channel layer; and forming a gate electrode, a source electrode and a drain electrode on the electron supplying layer. According to another aspect of the present invention, it is possible to restrain the occurrence of the semiconductor device with a low off-breakdown voltage.

According to the semiconductor device and the method of the same of the present invention, it is possible to restrain the occurrence of the semiconductor device with a low off-breakdown voltage.

DESCRIPTION OF THE PREFERRED EMBODIMENTS (Description of the embodiments of this invention) Firstly, the embodiments according to this invention will be listed and described. The semiconductor device according to an embodiment of the present invention includes: an silicon carbide (SiC) substrate; an aluminum nitride (AlN) layer provided on the SiC substrate and having an island-shaped pattern consisting of plural islands; a channel layer provided on the AlN layer and comprising a nitride semiconductor; an electron supplying layer provided on the channel layer and having a band gap larger than that of the channel layer; and a gate electrode, a source electrode and a drain electrode provided on the electron supply layer, wherein the AlN layer has an area-averaged circularity Y/X of greater than 0.2, in which Y is a sum of values obtained by multiplying circularities of the plural islands by areas of the plural islands respectively, and X is a sum of the areas of the plural islands, the circularity being calculated by a formula of $(4\pi \times area)/(length\ of\ periphery)^2$ where the area and the length of periphery in the formula are an area and a length of periphery of each island respectively. According to this embodiment of the present invention, it is possible to restrain the occurrence of the semiconductor device with a low off-breakdown voltage.

In the semiconductor device according to the above-embodiment, an average thickness of the AlN layer may be in a range between 5 nm and 50 nm.

In the semiconductor device according to the above embodiment, the channel layer may be a gallium nitride (GaN) layer.

In the semiconductor device according to the above embodiment, the electron supplying layer may be an aluminum gallium nitride (AlGaN) layer or an indium aluminum nitride (InAlN) layer.

In the semiconductor device according to the above embodiment, the thickness of the channel layer may be in a range between 0.5 µm and 2.0 µm.

In the semiconductor device according to the above embodiment, a cap layer may be provided on the electron supply layer and the cap layer may be composed of gallium nitride (GaN) layer.

The method of manufacturing a semiconductor device according to another embodiment of the present invention includes: forming an AlN layer on an SiC substrate by using a metal organic chemical vapor deposition (MOCVD) under conditions in which a growth temperature is equal to or lower than 1100° C., a growth pressure is equal to or higher than 38 Torr, and a ratio of raw gases V/III is equal to or larger than 500; forming a channel layer comprising a nitride semiconductor on the AlN layer; forming an electron supplying layer on the channel layer, the electron supplying layer having a band gap larger than that of the channel layer; and forming a gate electrode, a source electrode and a drain electrode on the electron supplying layer. According to this embodiment of the present invention, it is possible to restrain the occurrence of the semiconductor device with a low off-breakdown voltage.

In the method according to the above embodiment, the AlN layer may have an island-shaped pattern consisting of plural islands, and the AlN layer may have an area-averaged circularity Y/X of greater than 0.2, in which Y is a sum of values obtained by multiplying circularities of the plural islands by areas of the plural islands respectively, and X is a sum of the areas of the plural islands, the circularity being calculated by a formula of $(4\pi \times area)/(length\ of\ periphery)^2$ where the area and the length of periphery in the formula are an area and a length of periphery of each island.

In the method according to the above embodiment, an average thickness of the AlN layer may be in a range between 5 nm and 50 nm.

In the method according to the above embodiment, the raw gases may be include tri-methyl aluminum and ammonium.

In the method according to the above embodiment, the growth temperature may be equal to or higher than 900° C., the growth pressure may be equal to or lower than 200 Torr, and a ratio of raw gases V/III may be equal to or smaller than 10000.

In the method according to the above embodiment the thickness of the channel layer may be in a range between 0.5 µm and 2.0 µm.

In the method according to the above embodiment, a cap layer may be provided on the electron supply layer and the cap layer may be composed of gallium nitride (GaN) layer.

Figure 1:
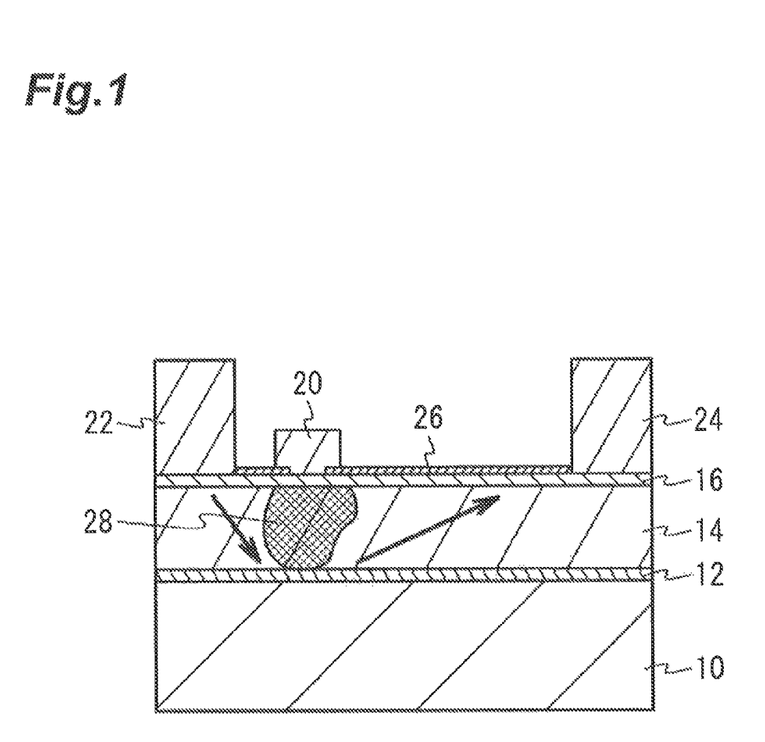
FIG. 1 is a sectional view illustrating a leakage current of a semiconductor device in an off state.

(Details of the embodiments of this invention) Next, a reason that semiconductor devices with a low off-breakdown voltage is mixed will be described. FIG. 1 is a sectional view illustrating a leakage current of a semiconductor device in an off state. As shown in FIG. 1, a semiconductor device has an SiC substrate 10, and an AlN layer 12, a channel layer 14, and an electron supplying layer 16 which are sequentially laminated on the substrate 10. A gate electrode 20 is provided on the electron supplying layer 16, and a source electrode 22 and a drain electrode 24 also are provided on the electron supplying layer 16 so that the gate electrode 20 is interposed between them. A protective film 26 is provided on a region of the electronic supplying layer 16, except for a region on which the gate electrode 20, the source electrode 22 and the drain electrode 24 are provided.

When a high negative voltage is applied to the gate electrode 20 and enables the semiconductor device to be in an off-state, a large depletion layer 28 is formed toward the SiC substrate 10 in the channel layer 14 under the gate electrode 20. For the reason, a leakage current flowing between the source electrode 22 and the drain electrode 24 flows near a boundary of the SiC substrate 10 and the AlN layer 12, as indicated by an arrow in FIG. 1.

Figure 2:
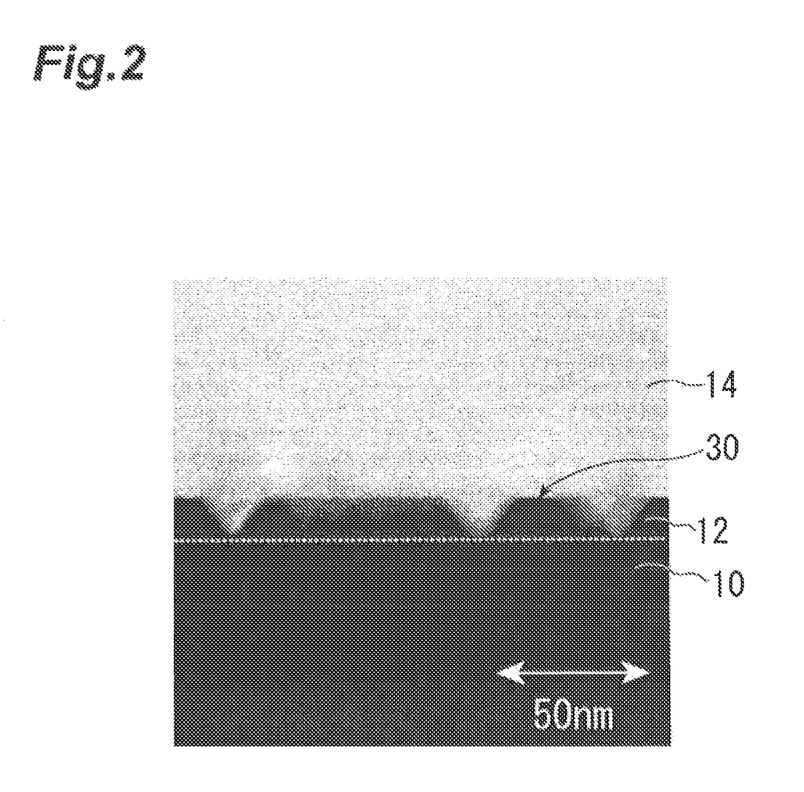
FIG. 2 is a Transmission Electron Microscope (TEM) image illustrating a shape of an Aluminum Nitride (AlN) layer formed on an SiC substrate.

Hereinafter, a shape of the AlN layer 12 formed on the SiC substrate 10 will be described. FIG. 2 is a Transmission Electron Microscope (TEM) image illustrating the shape of the Aluminum Nitride (AlN) layer formed on the SiC substrate. As shown in FIG. 2, the AlN layer 12 formed on the SiC substrate 10 is not flat, and has an island shaped pattern with a plurality of islands 30. The reason that the AlN layer has the island shaped pattern is that a growth mode of the AlN becomes a Stranski-Krastanov (S-K) growth mode due to a difference of a lattice constant between the SiC and the AlN.

Figure 3:
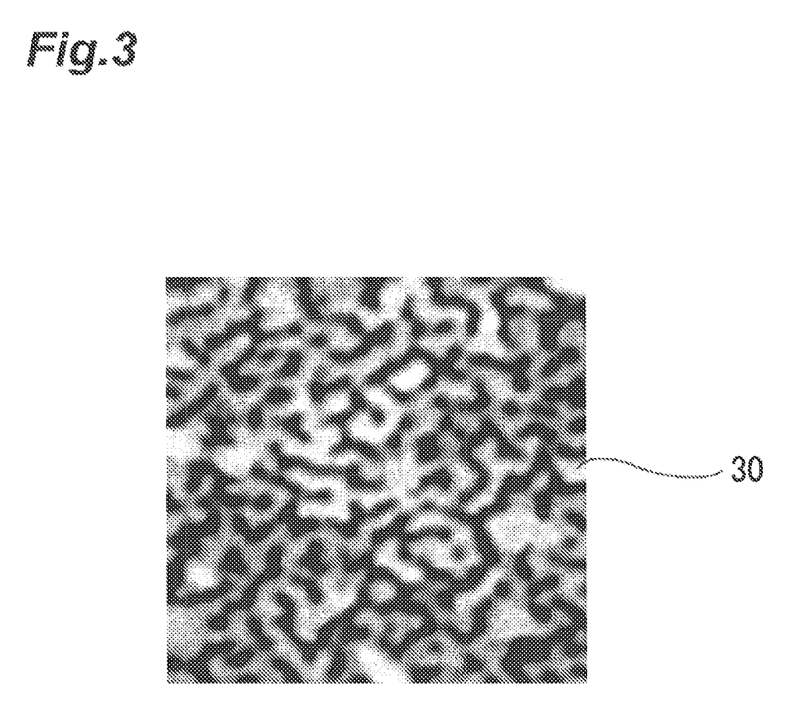
FIG. 3 is a Scanning Electron Microscope (SEM) image illustrating a shape of an Aluminum Nitride (AlN) layer formed on an SiC substrate.

FIG. 3 is a Scanning Electron Microscope (SEM) image illustrating a shape of an Aluminum Nitride (AlN) layer 12 formed on an SiC substrate 10. In FIG. 3, a surface of the AlN layer 12 formed on the SiC substrate 10 before the channel layer 14 and the like are formed is shown. As shown in FIG. 3, it can be recognized that the AlN layer 12 has an island shaped pattern with a plurality of islands 30. It is understood that regions where a large number of the adjacent islands 30 are connected to one another to occupy large areas and regions where a small number of the adjacent islands 30 are connected to one another to occupy small isolated areas are irregularly mixed.

A crystal distortion occurs in the AlN layer 12, of which an extent is different according to a size of the island 30. The crystal distortion increases in a relatively larger island 30, and decreases in a relatively smaller island 30. The AlN layer has a piezoelectric charge generated according to a stress due to the distortion, and a negative electric charge is generated in a crystal. As the extent of the crystal distortion is different according to the location in the AlN layer 12, magnitude of the generated electric charge is also different. In a structure in which the channel layer 14 comprising a nitride semiconductor is formed on the AlN layer 12, the electric charge generated in the AlN layer 12 raises an electric potential of the channel layer 14 at a side of the SiC substrate 10. Since the magnitude of the electric charge generated in the AlN layer 12 is different according to the location, an amount of raised electric charges is also different. As the result, the leakage current in pinch-off is variable, The island shaped pattern of the AlN layer 12 may be changed on AlN layers 12 formed on a plurality of the SiC substrates 10 respectively. Thereby, it may be considered that semiconductor devices with a low off-breakdown voltage are manufactured and mixed.

Hereinafter, embodiments capable of restraining a manufacturing of a semiconductor device with a low off-breakdown voltage by making the island shaped pattern of the AlN layer 12 formed on the SiC substrate 10 close to a state of an evenly isolated island, will be described.

First Embodiment

Figure 4:
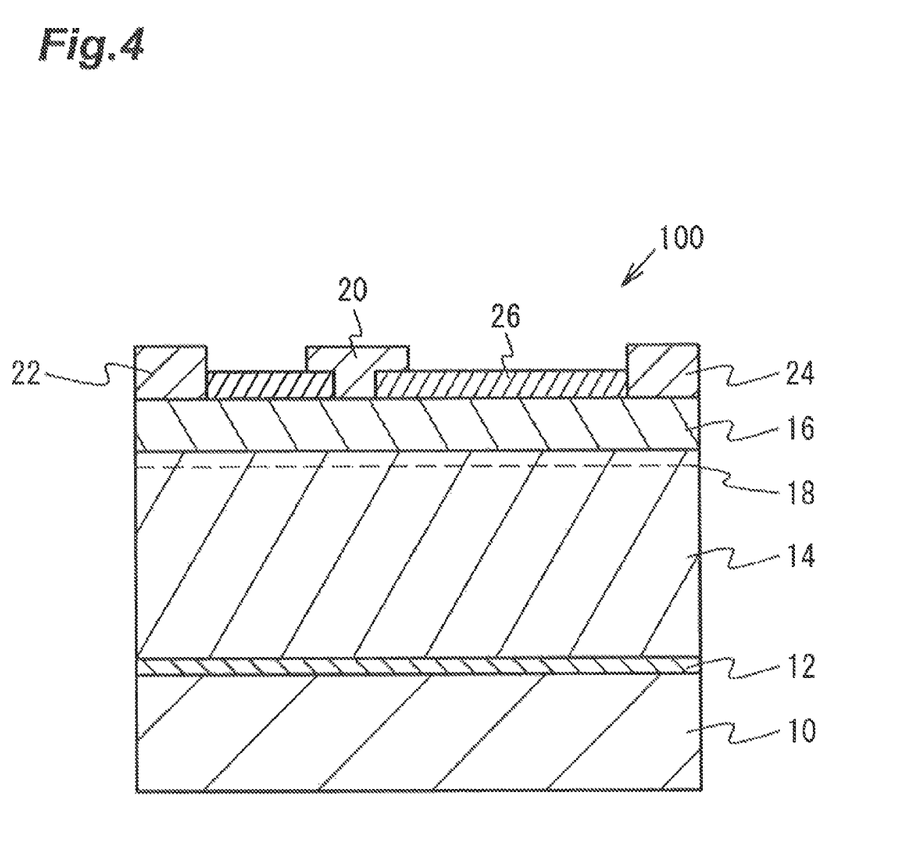
FIG. 4 is a sectional view of a semiconductor device according to a first embodiment of the present invention.

FIG. 4 is a sectional view of a semiconductor device according to a first embodiment of this invention. A semiconductor device of the first embodiment is an HEMT. As shown in FIG. 4, the semiconductor device 100 of the first embodiment has an AlN layer 12 provided on a semi-insulating SiC substrate 10. The AlN layer 12 is formed directly on the semi-insulating SiC substrate 10. The SiC substrate 10 has a structure of a hexagonal crystal system, e.g., 4H, 6H and the like. The AlN layer 12 is formed to be in contact with, for example, a (0001) Si surface of the SiC substrate 10. Use of the semi-insulating SiC substrate 10 is to restrain a loss in a high frequency operation. A channel layer 14, for example, comprising a gallium nitride (GaN) layer is provided on the AlN layer 12. The channel layer 14 is provided to be in contact with, for example, an upper surface of the AlN layer 12. An electronic supplying layer 16 is provided on the channel layer 14. The electronic supplying layer 16 has a larger band gap than the channel layer 14. That is, in the case where the channel layer 14 comprises the GaN layer, the electron supplying layer 16 has a larger band gap than the GaN layer. The electron supplying layer 16 is, for example, an aluminum gallium nitride (AlGaN) layer. The electron supplying layer 16 is formed to be in contact with, for example, an upper surface of the channel layer 14. A two dimensional electron gas (2DEG) 18 is formed at a side of the channel layer 14 on a boundary between the channel layer 14 and the electron supplying layer 16.

A gate electrode 20 is provided on the electron supplying layer 16, and a source electrode 22 and a drain electrode 24 also are provided on the electron supplying layer 16 so that the gate electrode 20 is interposed between them. The gate electrode 20 is a multi-layer metal film, for example, in which a Ni layer and an Au layer are sequentially laminated from a side of the SiC substrate 10. The source electrode 22 and the drain electrode 24 is a multi-layer metal film, for example, in which a Ti layer and an Al layer are sequentially laminated from a side of the SiC substrate 10. A protective film 26, for example, comprising an SiN film, is provided on a region of the electronic supplying layer 16, except for a region on which the gate electrode 20, the source electrode 22 and die drain electrode 24 are provided. Further, the gate electrode 20 may be formed, for example, on the GaN cap layer (not shown in figures) which is formed to be in contact with an upper surface of the electron supplying layer 16. In this case, a source electrode 22 and a drain electrode 24 may be formed to be in contact with the electron supplying layer 16 from which the GaN cap layer is removed.

An AlN layer 12 has an island shaped pattern consisting of a plurality of islands 30, as shown in FIGS. 2 and 3. Accordingly, the islands 30 constituting the AlN layer 12 are indicated by an index named circularity. The circularity refers to an index indicating how close to a circular shape something is, which is expressed by an Equation of circularity=(4π× area)/(length of periphery) (where the area and the length of the periphery represent the area and the length of the periphery of single island 30, respectively). That is, when the circularity is one (1), it is a true circle. Namely, in the Equation above, the units for the area and the length of periphery are selected such that the circularity becomes one (1) when the single island 30 is a true circle, A value (hereinafter, referred to as an area-averaged circularity of the AlN layer) obtained by area-averaging the circularity of the plural islands 30 constituting the AlN layer 12 is larger than 0.2. The value obtained by area-averaging the circularity refers to a value (Y/X) obtained by dividing a sum (Y) of the circularities multiplied by the areas of the plural islands 30 respectively by a sum (X) of the areas of the plural islands 30. That is, the value obtained by area-averaging the circularity can be expressed by a formula of $\Sigma(Ci \cdot Si)/\Sigma(Si)$. In the formula, Ci indicates a circularity of an $i^{th}$ island 30, and Si indicates an area of the $i^{th}$ island 30. A concept of the area average is introduced to weight the islands 30 with large areas, so that the circularity of the island 30 can be apparently and precisely expressed in comparison with a simple average circularity.

Here, making the area-averaged circularity of the AlN layer 12 greater than 0.2 will be described. The area-averaged circularity of the AlN layer 12, as described later, may be changed depending on a growth condition of the AlN layer 12. Accordingly, a plurality of semiconductor devices according to examples corresponding to the first embodiment which have different area-averaged circularities and the same structure as the structure of FIG. 4 were manufactured, and estimation of off-breakdown voltage for each semiconductor device was performed. Here, a semiconductor device in which the off-breakdown voltage was equal to or lower than 240V was defined as a semiconductor device with a low off-breakdown voltage.

Figure 5:
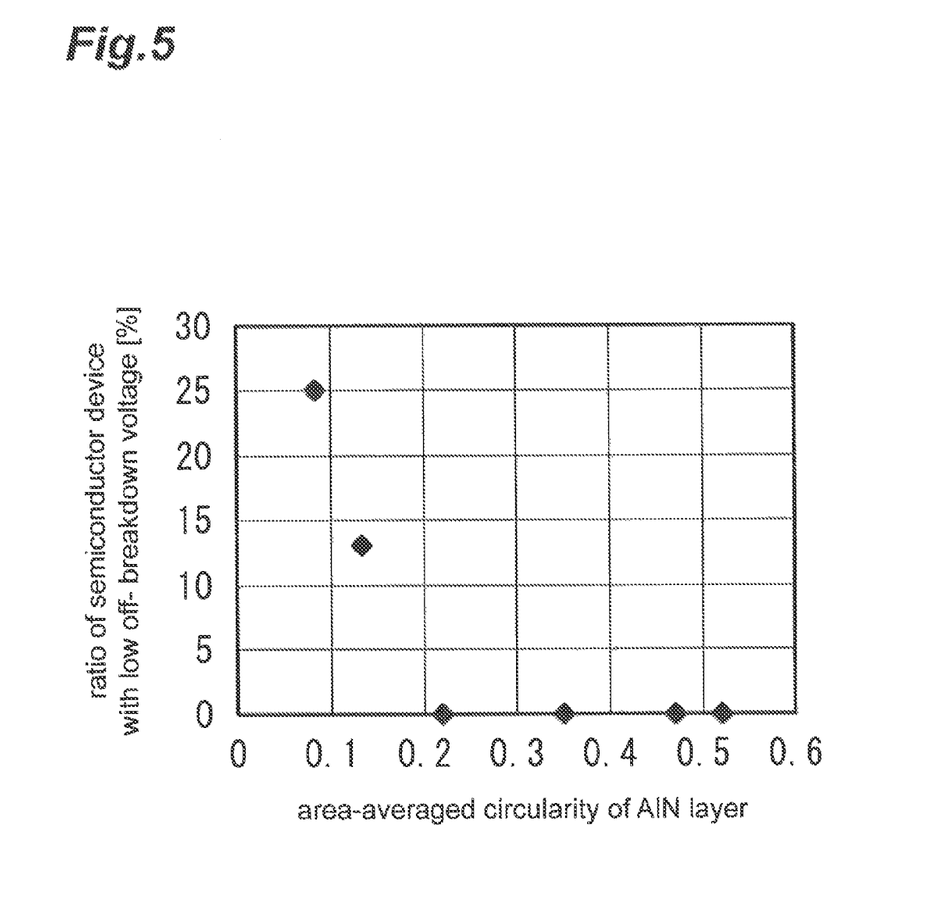
FIG. 5 is a graph illustrating a relation of an area-averaged circularity of the AlN layer to an occurrence frequency of a semiconductor device with a low off-breakdown voltage.

FIG. 5 is a graph illustrating a relation of an area-averaged circularity of the AlN layer 12 to an occurrence frequency of the semiconductor device according to examples corresponding to the first embodiment with the low off-breakdown voltage. In FIG. 5 a transverse axis indicates the area-averaged circularity of the AlN layer 12 in the examples corresponding to the first embodiment and a longitudinal axis indicates a ratio of the semiconductor device with the low off-breakdown voltage to all the manufactured semiconductor devices according to examples corresponding to the first embodiment. As shown in FIG. 5, when the area-averaged circularity of the AlN layer 12 becomes greater than 0.2, it can be seen that it is possible to restrain the occurrence of the semiconductor device with the low off-breakdown voltage.

According to the first embodiment, as described above, the area-averaged circularity of the AlN layer 12 formed on the SiC substrate 10 (namely, a value (Y/X) obtained by dividing the sum (Y) of the circularities multiplied by the areas of the plural islands 30 respectively by the sum X of the areas of the plural islands 30) becomes greater than 0.2. Thereby, it is possible to restrain the occurrence of the semiconductor device with the low off-breakdown voltage, as shown in FIG. 5. Accordingly, a manufacturing yield and reliability can be improved.

In view of more securely restraining the occurrence of the semiconductor device with the low off-breakdown voltage, the area-averaged circularity of the AlN layer preferably is greater than 0.3, and more preferably greater than 0.4.

Figure 6:
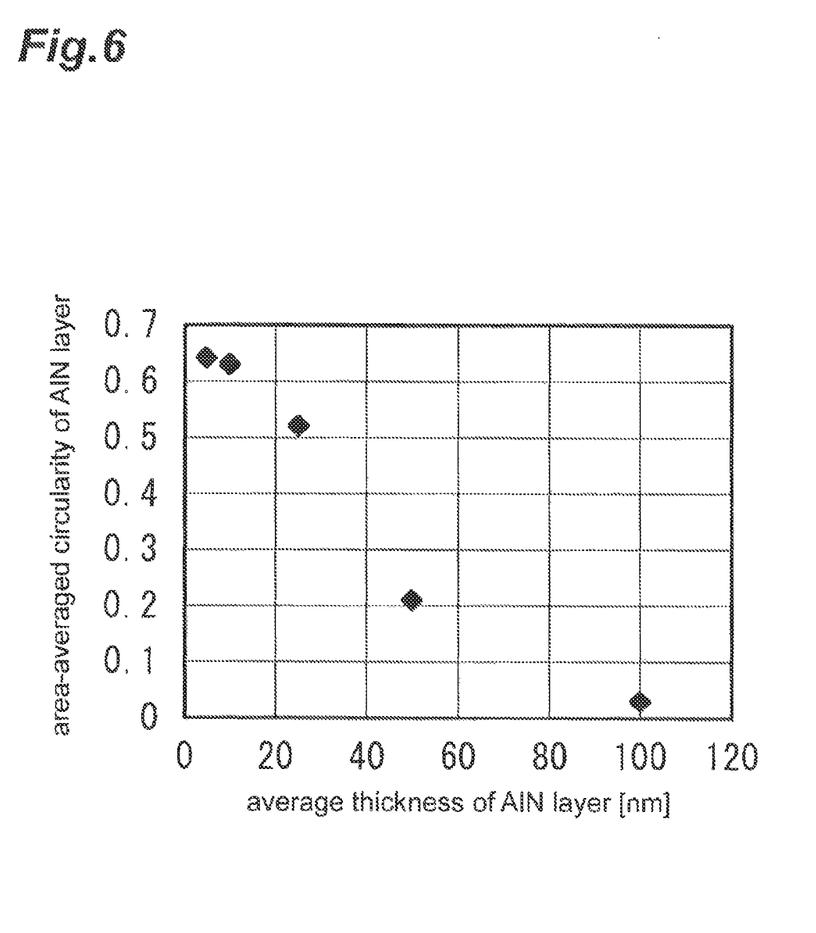
FIG. 6 is a graph illustrating a relation of the average thickness of the AlN layer formed on the SiC substrate to the area-averaged circularity of the AlN layer.

An average thickness of the AlN layer 12 preferably is in a range between 5 nm and 50 nm. The reason will be described with reference to FIG. 6. FIG. 6 is a graph illustrating a relation of the average thickness of the AlN layer formed on the SiC substrate to the area-averaged circularity of the AlN layer in the examples corresponding to the first embodiment. In FIG. 6, a transverse axis indicates the average thickness of the AlN layer, and a longitudinal axis indicates the area-averaged circularity of the AlN. Further, the AlN layer in the examples corresponding to the first embodiment shown in FIG. 6 has only a different thickness, and an identical growth condition. Further, the average thickness of the AlN layer 12 refers to an average thickness considering prominences and depressions of the plural islands constituting the AlN layer.

As shown in FIG. 6, it can be understood that the thicker the AlN layer is, the smaller the area-averaged circularity of the AlN layer is. As described with reference to FIG. 5, since the area-averaged circularity of the AlN layer 12 is made be greater than 0.2 in order to restrain the occurrence of the semiconductor device with the low off-breakdown voltage, the average thickness of the AlN layer 12 is preferably equal to or smaller than 50 nm. In view of increasing the area-averaged circularity of the AlN layer 12, the average thickness of the AlN layer 12 is preferably equal to or smaller than 40 nm, and more preferably equal to or smaller than 30 nm. In view of enabling the AlN layer 12 to function as a buffer layer, the average thickness of the AlN layer 12 is preferably equal to or greater than 5 nm, more preferably equal to or greater than 10 nm, and most preferably equal to or greater than 15 nm.

In the case where the channel layer 14 is a GaN layer, if a thickness of the channel layer 14 is thinner than 0.5 μm, a mobility of electrons decreases due to the crystal distortion. Accordingly, the thickness of the channel 14 is preferably equal to or greater than 0.5 μm, more preferably equal to or greater than 0.75 μm, and most preferably equal to or greater than 1.0 μm. Further, if the thickness of the channel layer 14 is thicker than 2.0 μm, a crack may occur. Accordingly, the thickness of the channel 14 is preferably equal to or smaller than 2.0 μm, more preferably equal to or smaller than 1.5 μm, and most preferably equal to or smaller than 1.0 μm. For example, the channel layer 14 preferably consists of a single layer film, and in this case the thickness of the single layer film is preferably in the above-mentioned range.

According to the first embodiment, as shown in FIG. 4, although a cap layer is not provided on the electron supplying layer 16, the cap layer may be provided on the electron supplying layer 16. For example, a GaN layer can be used as the cap layer.

Figure 7:
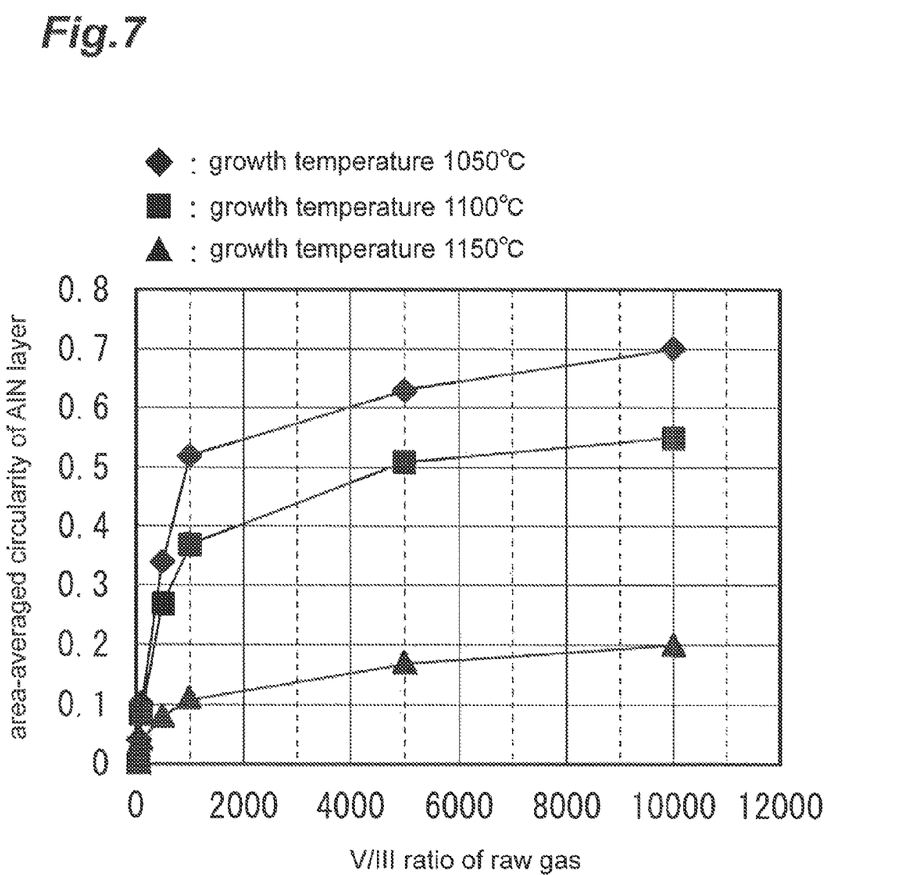
FIG. 7 is a graph illustrating a relation of the growth temperature and the ratio of raw gases V/III of the AlN layer to the area-averaged circularity of the AlN layer.

Next, a relation of the growth condition to the area-averaged circularity of the AlN layer in examples corresponding to the first embodiment in the case where the AlN layer is formed on the SiC substrate by using a Metal-Organic Chemical Vapor Deposition (MOCVD) will be described. Firstly, in the examples corresponding to the first embodiment where the AlN layer had been formed at a thickness of 25 nm on the SiC substrate by using the MOCVD under conditions in which a growth pressure had been constantly maintained at 50 Torr, a growth temperature had been changed and a ratio of raw gases V/II had been changed, the area-averaged circularities of the AlN layers were estimated. Tri-Methyl Aluminum (TMA) and ammonium ($NH_3$) were used as the raw gases. FIG. 7 is a graph illustrating a relation of the growth temperature and the ratio of raw gases V/III of the AlN layer to the area-averaged circularity of the AlN layer. In FIG. 7, a transverse axis indicates the ratio of the raw gases V/III, and a longitudinal axis indicates the area-averaged circularity of the AlN layer. In FIG. 7, a diamond-shaped mark indicates a case where the growth temperature is 1050° C., a square-shaped mark indicates a case where the growth temperature is 1100° C., and a triangle-shaped mark indicates a case where the growth temperature is 1150° C. As shown in FIG. 7, it can be understood that if the growth temperature is set to be equal to or lower than 1100° C. and the ratio of the raw gases V/III is set to be equal to or greater than 500, the area-averaged circularity of the AlN layer is made to be greater than 0.2.

Under a condition where the growth temperature is low and a large amount of $NH_3$ gas is present, a combination of islands constituting the AlN layer is difficult because of a difficulty in the movement of the Al, and the area-averaged circularity increases.

Figure 8:
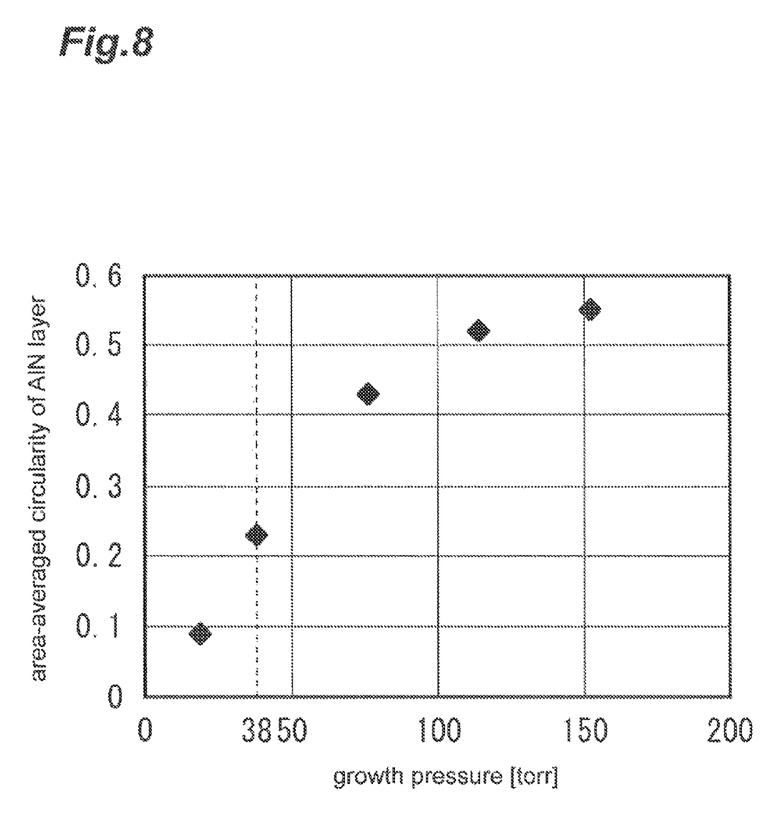
FIG. 8 is a graph illustrating a relation of a growth pressure of the AlN layer to the area-averaged circularity of the AlN layer.

Then, in the examples corresponding to the first embodiment where the AlN layer had been formed at a thickness of 25 nm on the SiC substrate by using the MOCVD under conditions in which a growth temperature and a ratio of raw gases V/III had been constantly maintained at 1100° C. and 500 respectively and a growth pressure had been changed, the area-averaged circularity of the AlN layer was estimated. FIG. 8 is a graph illustrating a relation of a growth pressure of the AlN layer to the area-averaged circularity of the AlN layer in the examples corresponding to the first embodiment. In FIG. 8, a transverse axis indicates the growth pressure, and a longitudinal axis indicates the area-averaged circularity of the AlN layer. As shown in FIG. 8, it can be understood that when the growth pressure is set to be equal to or higher than 38 Torr, the area-averaged circularity of the AlN layer may be made to be greater than 0.2, Under a condition in which the growth pressure is high, a combination of islands constituting the AlN layer is difficult because of a difficulty in the movement of the Al, and the area-averaged circularity increases.

With the semiconductor device 100 of the first embodiment, as described above, the AlN layer 12 is formed on the SiC substrate 10 by using the MOCVD under conditions in which the growth temperature is equal to or lower than 1100° C., the growth pressure is equal to or higher than 38 Torr, and the ratio of the raw gases V/III is equal to or larger than 500, so as to make the area-averaged circularity of the AlN layer 12 greater than 0.2. Thereby, it is possible to restrain the occurrence of the semiconductor device with the low off-breakdown voltage.

In view of increasing the area-averaged circularity of the AlN layer 12, the growth temperature of the AlN layer 12 is preferably equal to or lower than 1050° C. more preferably equal to or lower than 1000° C., and most preferably equal to or lower than 950° C. The growth pressure of the AlN layer 12 is preferably equal to or higher than 50 Torr, more preferably equal to or higher than 75 Torr, and most preferably equal to or higher than 100 Torr. In forming of the AlN layer 12, the ratio of the raw gases V/III is preferably equal to or greater than 1000, more preferably equal to or greater than 1500, and most preferably equal to or greater than 2000. Further, the growth temperature may have a general lower limit of 900° C., and the growth pressure may have a general upper limit of 200 Torr. The ratio of the raw gases V/III may have a general upper limit of 10000.

The description of the semiconductor device according to the second embodiment will be omitted since it has the same structure as that of the first embodiment in FIG. 4. Hereinafter, a method of manufacturing the semiconductor device according to the second embodiment will be described. In the method of manufacturing the semiconductor device of the second embodiment, an AlN layer 12 is grown on a semi-insulating SiC substrate 10 by using the MOCVD under the following conditions.

Figure 9:
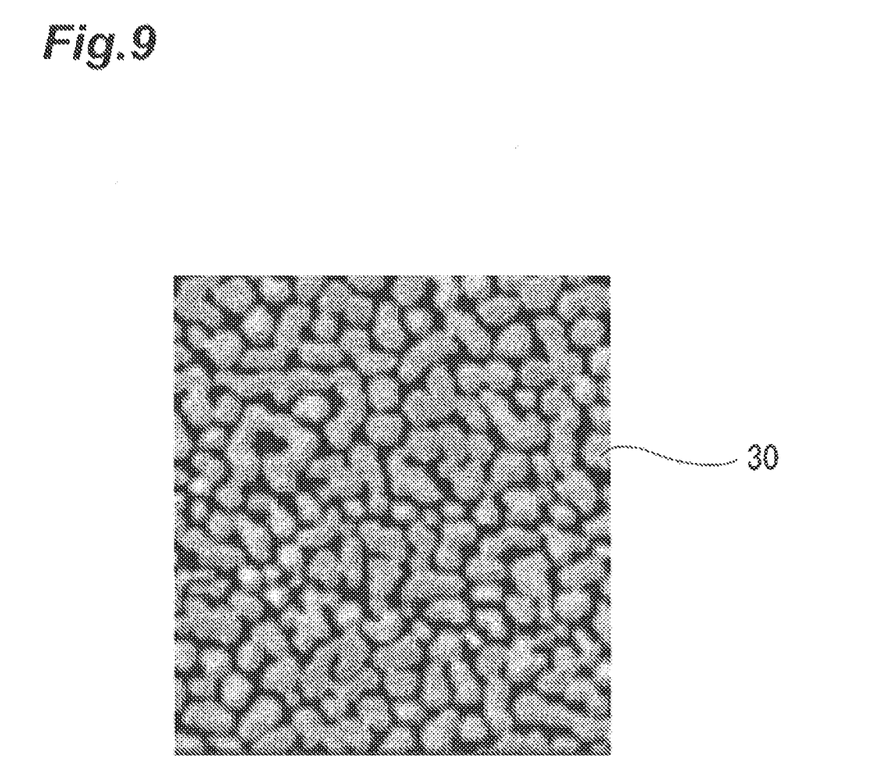
FIG. 9 is a view showing extracted outlines of islands in a surface SEM image of the AlN layer of the semiconductor device of a second embodiment with an image processing software.

Raw gas: Tri-Methyl Aluminum (TMA), ammonia ($NH_3$)
Growth temperature: 1050° C.
Growth pressure: 76 Torr
Ratio of V/III: 1000
Average thickness: 25 nm As to example corresponding to the second embodiment, when the AlN layer 12 was formed on the SiC substrate 10, a surface status of the AlN layer 12 was observed by using a SEM. FIG. 9 is a view illustrating extracted outlines of islands 30 in a surface SEM image of the AlN layer 12 of the semiconductor device of the example corresponding to the second embodiment with image processing software. As shown in FIG. 9, the AlN layer 12 was similar to an island-shaped pattern consisting of plural islands 30 which are evenly isolated, and the area-averaged circularity of the AlN layer 12 was 0.52.

Next, a channel layer 14 comprising a GaN layer is grown on the AlN layer 12 by using the MOCVD under the following conditions.
Raw gas: Tri-Methyl Gallium (TMG), NH$_3$
Growth temperature: 1100"C
Growth Pressure: 100 Torr
Thickness: 1 μm In turn, for example, an electron supplying layer 16 comprising an AlGaN layer is grown on the channel layer 14 by using the MOCVD under the following condition.
Raw gas: TMA, TMG, NH$_3$
Growth temperature: 1080° C.
Growth Pressure: 100 Torr
Thickness: 25 nm
Al composition ratio: 20%

Then, a protective film 26 which comprises an AlN film and has a thickness of 100 nm is formed on the electron supplying layer 16, for example, by using the Chemical Vapor Deposition (CVD). Continuously, a gate electrode 20 in which a Ni layer and an Au layer are laminated from a side of the SiC substrate 10 is formed on the electron supplying layer 16, for example, by using a deposition and a lift-off. A source electrode 22 and a drain electrode 24, which are ohmic electrodes and in each of which a Ti layer and an Al layer are laminated from a side of the SiC substrate 10, are formed at both sides of the gate electrode 20, for example, by using the deposition and lift-off. A length of the gate is, for example, 0.9 μm, and a distance between the source and the gate is, for example, 1.5 μm, and a distance between the source and the drain is, for example, 8 μm.

Figure 10:
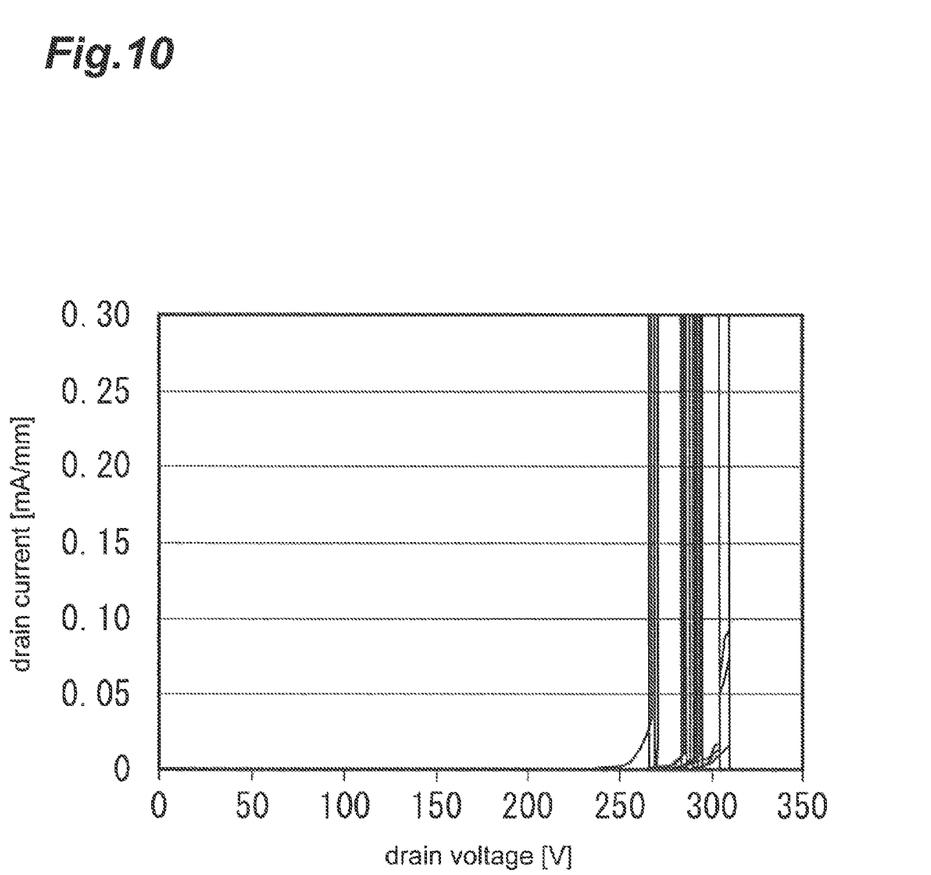
FIG. 10 is a graph illustrating a result from a measurement of the off-breakdown voltage of the semiconductor device of the second embodiment.

With respect to each of the plural semiconductor devices of examples manufactured by the methods according to the second embodiment, an off-breakdown voltage was measured. The off-breakdown voltage was defined as the voltage at which the semiconductor device was broken down when a gate voltage was set to −10V, sufficiently lower than a threshold voltage of −3V, and a drain voltage was gradually increased and was measured. FIG. 10 is a graph illustrating a result from a measurement of the off-breakdown voltage of the semiconductor device of the examples manufactured by the method according to the second embodiment. In FIG. 10, a transverse axis indicates a drain voltage, and a longitudinal axis indicates a drain current. As shown in FIG. 10, in the case where a semiconductor device of which an off-breakdown voltage is equal to or lower than 240V is defined as a semiconductor device with a low off-breakdown voltage, in the semiconductor device of the second embodiment, an occurrence of the semiconductor device with the low off-breakdown voltage was restrained.

Figure 11:
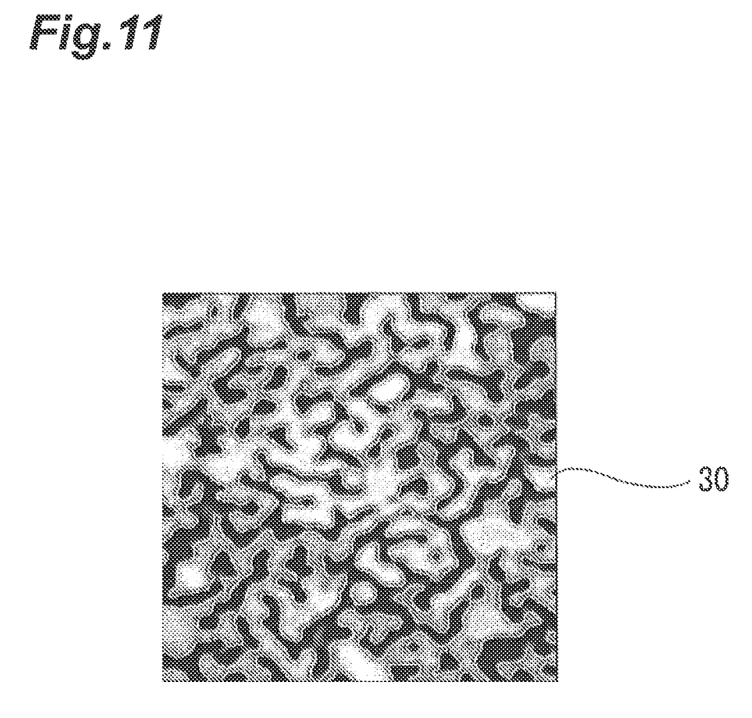
FIG. 11 is a view showing extracted outlines of islands in a surface SEM image of the AlN layer of the semiconductor device of a comparative example 1 with the image processing software.

Hereinafter, a semiconductor device according to comparative examples 1 will be described. Similarly to the examples manufactured by the method according to the second embodiment, the semiconductor device according to the comparative examples 1 have the same structure as that of the first embodiment of FIG. 4. In the semiconductor device of the comparative example 1, an AlN layer 12 was grown on a semi-insulating SiC substrate 10 by using the MOCVD under the following conditions.
Raw gas: TMA, NH$_3$
Growth temperature: 1100° C.
Pressure: 38 torr
Ratio of V/III: 100
Average thickness: 25 nm As to one of the comparative examples 1, when the AlN layer 12 was formed on the SiC substrate 10, a surface status of the AlN layer 12 was observed by using a SEM. FIG. 11 is a view illustrating extracted outlines of islands in a surface SEM image of the AlN layer 12 of the semiconductor device according to the comparative example 1 with image processing software. As shown in FIG. 11, the AlN layer 12 had an uneven shape of the islands 30 in comparison with the case of the second embodiment, and the area-averaged circularity of the AlN layer 12 was 0.083.

Figure 12:
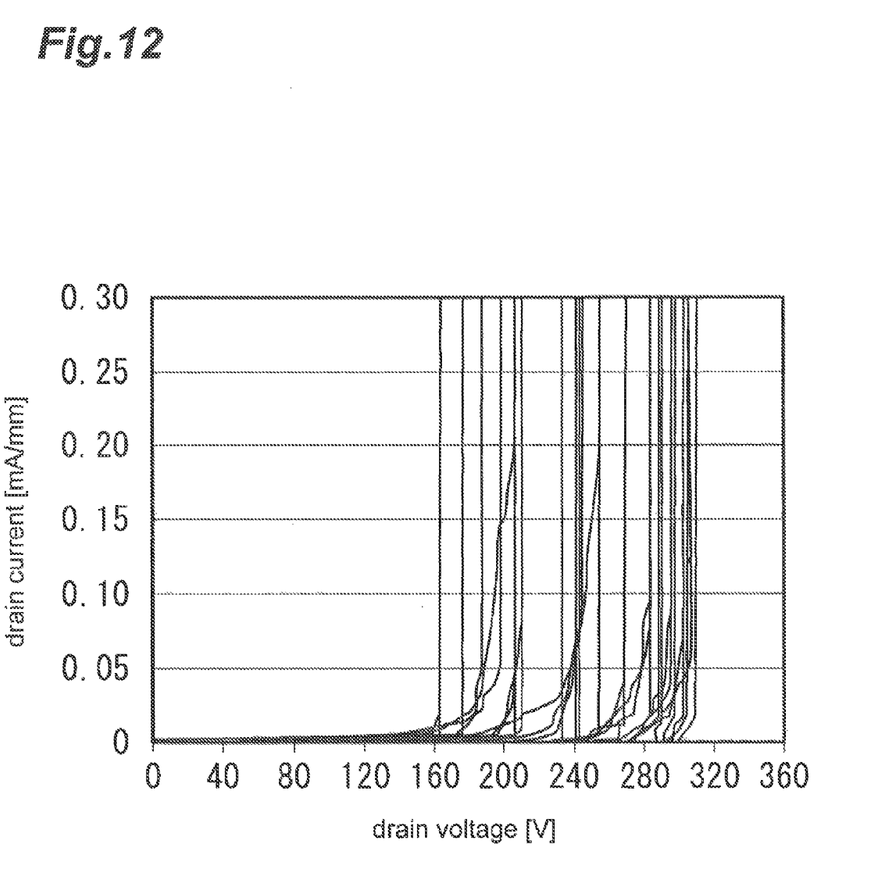
FIG. 12 is a graph illustrating a result from a measurement of the off-breakdown voltage of the semiconductor device of the comparative example.

The manufacturing of the semiconductor after the AlN layer 12 was formed was performed by using the same method as that of the second embodiment. With respect to each of the plural semiconductor devices of the comparative examples manufactured by the methods, an off-breakdown voltage was measured. The measurement of the off-breakdown voltage was performed by using an identical method to that of the second embodiment. FIG. 12 is a graph illustrating a result from a measurement of the off-breakdown voltage of the semiconductor device of the comparative examples 1. In FIG. 12, a transverse axis indicates a drain voltage, and a longitudinal axis indicates a drain current. As shown in FIG. 12, the semiconductor device with the low off-breakdown voltage (semiconductor device of which the off-breakdown voltage is equal to or lower than 240V) occurred with a probability of 25%.

Similar to the examples manufactured by the method according to the second embodiment, the AlN layer 12 was formed by using the MOCVD under conditions in which a growth temperature was 1050° C. (lower than 1100° C.), a pressure was 76 Torr (higher than 38 Torr), and a ratio of raw gases V/III was 1000 (higher than 500). Thus, the areas averaged circularity of the AlN layer 12 could be improved to be greater than 0.2, as shown in FIG. 9. Thereby, it was possible to restrain the occurrence of the semiconductor device with the low off-breakdown voltage, as shown in FIG. 10.

A surface of the AlN layer 12 was observed by using the SEM, but the observation was not limited thereto. Also, the AlN layer 12 may be observed by other methods. For example, the AlN layer 12 may be observed by using the TEM after the semiconductor device is cut in the form of a thin film including the AlN layer 12 in a direction parallel with an upper surface of the SiC substrate 10. In other words, the observation of the AlN layer 12 may be performed by a plane slice TEM.

In the first and second embodiments, although it is described that the channel layer 14 is formed of a GaN layer, the channel layer may be formed of other nitride semiconductor layers. Further, the nitride semiconductor refers to a gallium nitride (GaN), an indium nitride (InN), an aluminum nitride (AlN), an aluminum gallium nitride (AlGaN), an indium gallium nitride (InGaN), an indium aluminum nitride (InAlN), an indium aluminum gallium nitride (InAlGaN) and the like. The electron supply layer 16 may be formed of a nitride semiconductor which has a band gap larger than that of the channel layer 14. For example, when the channel layer 14 is formed of the GaN layer, the electron supplying layer 16 may be formed of the AlGaN layer or the InAlN layer. Further, the raw gas for use in the growth of the AlN layer 12 is not limited to the TMA and NH$_3$, but other gases may be used for growing the AlN layer 12.

While the embodiments and the examples of the present invention have been described, the present invention is not limited to the specific embodiments and the examples and may be variously changed and modified without departing from the scope of the present invention. Description of reference numerals

What is claimed is:

1. A semiconductor device comprising:
a silicon carbide (SIC) substrate;
an aluminum nitride (AlN) layer provided on the SiC substrate and having an island-shaped pattern consisting of plural islands;
a channel layer provided on the AlN layer and comprising a nitride semiconductor;
an electron supplying layer provided on the channel layer and having a band gap larger than that of the channel layer; and
a gate electrode, a source electrode and a drain electrode provided on the electron supply layer,
wherein the AlN layer has an area-averaged circularity Y/X of greater than 0.2, in which Y is a sum of values obtained by multiplying circularities of the plural islands by areas of the plural islands respectively, and X is a sum of the areas of the plural islands, the circularity being calculated by a formula of $(4\pi \times area)/(length\ of\ periphery)^2$ where the area and the length of periphery in the formula are an area and a length of periphery of each island respectively.

2. The semiconductor device according to claim 1, wherein an average thickness of the AlN layer is in a range between 5 nm and 50 nm.

3. The semiconductor device according to claim 1, wherein the channel layer is a gallium nitride (GaN) layer.

4. The semiconductor device according to claim 3, wherein the electron supplying layer is an aluminum gallium nitride (AlGaN) layer or an indium aluminum nitride (InAlN) layer.

5. The semiconductor device according to claim 1, wherein the thickness of the channel layer is in a range between 0.5 µm and 2.0 µm.

6. The semiconductor device according to claim 1, wherein a cap layer is provided on the electron supply layer and the cap layer is composed of a gallium nitride (GaN) layer.

7. A method of manufacturing a semiconductor device, the method comprising:
forming an AlN layer on an SiC substrate by using a metal organic chemical vapor deposition (MOCVD) under conditions in which a growth temperature is equal to or lower than 1100° C., a growth pressure is equal to or higher than 38 Torr, and a ratio of raw gases V/III is equal to or larger than 500;
forming a channel layer comprising a nitride semiconductor on the AlN layer;
forming an electron supplying layer on the channel layer, the electron supplying layer having a band gap larger than that of the channel layer; and
forming a gate electrode, a source electrode and a drain electrode on the electron supplying layer,
wherein the AlN layer has an island-shaped pattern consisting of plural islands, and wherein the AlN layer has an area-averaged circularity Y/X of greater than 0.2, in which Y is a sum of values obtained by multiplying circularities of the plural islands by areas of the plural islands respectively, and X is a sum of the areas of the plural islands, the circularity being calculated by a formula of $(4\pi \times area)/(length\ of\ periphery)^2$ where the area and the length of periphery in the formula are an area and a length of periphery of each island respectively.

8. The method according to claim 7, wherein an average thickness of the AlN layer is in a range between 5 nm and 50 nm.

9. The method according to claim 7, wherein the raw gases include tri-methyl aluminum and ammonium.

10. The method according to claim 7, wherein the growth temperature is equal to or higher than 900° C., the growth pressure is equal to or lower than 200 Torr and a ratio of raw gases V/III is equal to or smaller than 10000.

11. A method of manufacturing a semiconductor device, the method comprising:
forming an AlN layer on an SiC substrate by using a metal organic chemical vapor deposition (MOCVD) under conditions in which a growth temperature is equal to or lower than 1100° C., a growth pressure is equal to or higher than 38 Torr, and a ratio of raw gases V/III is equal to or larger than 500;
forming a channel layer comprising a nitride semiconductor on the AlN layer;
forming an electron supplying layer on the channel layer, the electron supplying layer having a band gap larger than that of the channel layer; and
forming a gate electrode, a source electrode and a drain electrode on the electron supplying layer,
wherein the thickness of the channel layer is in a range between 0.5 µm and 2.0 µm.

12. The method according to claim 11, wherein an average thickness of the AlN layer is in a range between 5 nm and 50 nm.

13. The method according to claim 11, wherein the raw gases include tri-methyl aluminum and ammonium.

14. The method according to claim 11, wherein the growth temperature is equal to or higher than 900° C., the growth pressure is equal to or lower than 200 Torr, and a ratio of raw gases V/III is equal to or smaller than 10000.

15. A method of manufacturing a semiconductor device, the method comprising:
forming an AlN layer on an SiC substrate by using a metal organic chemical vapor deposition (MOCVD) under conditions in which a growth temperature is equal to or lower than 1100° C., a growth pressure is equal to or higher than 38 Torr, and a ratio of raw gases V/III is equal to or larger than 500;
forming a channel layer comprising a nitride semiconductor on the AlN layer;
forming an electron supplying layer on the channel layer, the electron supplying layer having a band gap larger than that of the channel layer; and
forming a gate electrode, a source electrode and a drain electrode on the electron supplying layer,
wherein a cap layer is provided on the electron supply layer and the cap layer is composed of a gallium nitride (GaN) layer.

16. The method according to claim 15, wherein an average thickness of the AlN layer is in a range between 5 nm and 50 nm.

17. The method according to claim 15, wherein the raw gases include tri-methyl aluminum and ammonium.

18. The method according to claim 15, wherein the growth temperature is equal to or higher than 900° C., the growth pressure is equal to or lower than 200 Torr, and a ratio of raw gases V/III is equal to or smaller than 10000.

* * * * *